United States Patent [19]

Jordan

[11] Patent Number: 5,336,948
[45] Date of Patent: Aug. 9, 1994

[54] ACTIVE NEGATION EMULATOR

[75] Inventor: Mark Jordan, Goffstown, N.H.

[73] Assignee: Unitrode Corporation, Billerica, Mass.

[21] Appl. No.: 991,168

[22] Filed: Dec. 16, 1992

[51] Int. Cl.⁵ .............................................. H03K 17/16
[52] U.S. Cl. ................................... 307/443; 307/475; 307/263
[58] Field of Search ........................ 307/447, 475, 263

[56] References Cited

U.S. PATENT DOCUMENTS

| 3,832,575 | 8/1974 | Dasgupta et al. | 307/208 |
| 3,947,776 | 3/1976 | Stevens et al. | 328/147 |
| 4,345,171 | 8/1982 | Harris, Jr. | 307/560 |
| 4,384,216 | 5/1983 | Pricer | 307/270 |
| 4,390,797 | 6/1983 | Ishimoto | 307/264 |
| 4,398,100 | 8/1983 | Tobita et al. | 307/264 |
| 4,421,994 | 12/1983 | Puri et al. | 307/200 B |
| 4,498,021 | 2/1985 | Uya | 307/443 |
| 4,598,216 | 7/1986 | Lauffer | 307/443 |
| 4,612,462 | 9/1986 | Asano | 307/443 |
| 4,647,797 | 3/1987 | Sanwo | 307/443 |
| 4,675,551 | 6/1987 | Stevenson et al. | 307/443 |
| 4,859,877 | 8/1989 | Cooperman et al. | 307/443 |
| 4,947,063 | 8/1990 | O'Shaughnessy et al. | 307/572 |
| 4,970,419 | 11/1990 | Hagen et al. | 307/542 |
| 5,012,384 | 4/1991 | Chew | 361/159 |
| 5,029,284 | 7/1991 | Feldbaumer et al. | 307/443 |
| 5,089,948 | 2/1992 | Brown et al. | 363/58 |

Primary Examiner—Edward P. Westin
Assistant Examiner—Andrew Sanders
Attorney, Agent, or Firm—Weingarten, Schurgin, Gagnebin & Hayes

[57] ABSTRACT

An active negation emulator circuit for improving the noise margin of signals carried by a signal interface bus. The circuit includes a sensor for sensing the voltage on the bus and a variable current source for supplying a current to the bus when the voltage level thereon is greater than a predetermined value. More particularly, when the voltage level on the bus is indicative of the signal carried thereby being in a logic high state, a current is supplied to raise the voltage level to the desired logic high voltage level. A combination circuit is also provided including an active negation emulator circuit, a resistive terminator, and switch means for selectively coupling the active negation emulator to the signal interface bus, coupling the resistive terminator to the signal interface bus, or decoupling both the emulator and the terminator from the bus, in accordance with the location of the bus to which the combination circuit is coupled.

37 Claims, 4 Drawing Sheets

ACTIVE NEGATION EMULATOR

FIELD OF THE INVENTION

This invention relates generally to a circuit for improving the noise margin of signals carried by a signal interface bus and more particularly to a combination circuit switchable between a first bus termination mode and a second responsive driving mode.

BACKGROUND OF THE INVENTION

As is known in the art of computer systems, devices such as the processor, the memory, and input/output devices communicate by transmitting and receiving signals along a signal interface bus to which the devices are coupled. More particularly, such devices include a driver circuit which couples signals to the bus for transmission to other devices, and a receiver which couples signals from the bus to the devices. In order to reduce undesirable signal reflections, generally the signal bus is terminated, such as by a resistive network, at the ends thereof so that the impedance of the bus matches that of the driver circuits. However, since termination is achieved at the ends of the bus, it often becomes necessary to change the location of terminators along the signal bus, such as when the bus is extended. That is, when the computer system configuration is modified, often the location of the terminators must also be changed so that the terminators remain at the ends of the signal bus.

As is also known, the signals carried by a signal interface bus are logic signals characterized as being in either a logic high state or a logic low state. More particularly, a logic low state may correspond to a voltage level below a first predetermined value and a logic high state may correspond to a voltage level above a second predetermined value, and the first and second predetermined values may or may not be equal. For example, in the case of a conventional SCSI (Small Computer Systems Interface) bus receiver, a voltage level below 0.5 volts corresponds to a logic low state and a voltage level above 2.0 volts corresponds to a logic high state. Often the integrity of such logic signals is degraded in that the high and/or low logic state voltage levels thereof do not correspond to the desired voltage levels or amplitudes. Such degradation may result from a mismatch between the impedance of the bus cable and the impedance of the terminator.

SUMMARY OF THE INVENTION

The invention relates to an active negation emulator circuit operating as a responsive driver for improving the noise margin of logic signals carried by a signal interface bus, comprising a sensor for sensing the voltage on the bus, and a variable current source, coupled to the sensor, for supplying a current to the bus when the sensed voltage exceeds a first predetermined value. In one embodiment, the sensor comprises a comparator having a first input coupled to the bus, a second input coupled to a reference voltage, and an output. The variable current source comprises a switch having a first terminal coupled to the bus, a second terminal, and a control terminal coupled to the output of the comparator with the switch selectively opening and closing in response to the output of the comparator. The circuit may further comprise means for opening the switch to stop the supply of current to the bus when the voltage exceeds a second predetermined value.

With this arrangement, a responsive driving circuit is provided for improving the noise margin of logic signals carried by a signal interface bus. More particularly, the sensor determines whether the signal carried by the bus is in a logic high or a logic low state. When the bus voltage exceeds the first predetermined value, indicative of a high logic state, but has not reached a desired logic high voltage amplitude, the variable current source supplies a current to the bus to raise the voltage level of the signal to the desired logic high voltage amplitude. In this way, the signal noise margin is improved. Furthermore, the supply of current is stopped when the bus voltage exceeds the second predetermined value, indicative of the desired logic high voltage amplitude. In this way, excess power dissipation caused by unnecessarily supplying current, as well as signal overshoot, is prevented.

In accordance with a further aspect of the invention, a combination circuit, adapted for coupling to a signal interface bus, comprises a resistive terminator and a responsive driver for supplying a current to the bus in response to the bus voltage exceeding a first predetermined value. Also provided is switch means for selectively coupling the resistive terminator to the bus, coupling the responsive driver to the bus, or decoupling both the terminator and the responsive driver from the bus. More particularly, the resistive terminator is coupled to the bus when the combination circuit is coupled to one of a pair of ends of the bus and the responsive driver is coupled to the bus when the combination circuit is coupled to the bus at a location between the pair of ends thereof.

With this arrangement, a combination circuit is provided that is operable in, or switchable between, two modes. That is, the circuit operates either as a bus terminator, when it is coupled to an end of the signal interface bus, or as a responsive driver, when such circuit is coupled to the bus between the ends thereof. In this way, the need to re-locate a terminator along the bus is eliminated. More particularly, terminators are generally required at the ends of the bus. Preferably, a plurality of combination circuits are coupled to the bus along the length thereof. Thus, when the bus is expanded for example, the switch of the combination circuit coupled to the "new" end thereof (for example, such location being that to which a new peripheral device is now coupled) will be positioned to couple the terminator to the bus; whereas, the switch of the combination circuit coupled to the "old" end is positioned to couple the responsive driver to the bus. Furthermore, when the responsive driver is coupled to the bus, the noise margin of logic signals on the bus is improved. That is, when the bus voltage is at a level indicative of a logic high state, the responsive driver supplies a current to the bus, thereby raising the signal voltage level to the desired logic high voltage level.

BRIEF DESCRIPTION OF THE DRAWINGS

The foregoing features of this invention, as well as the invention itself, may be more fully understood from the following detailed description of the drawings in which.

DESCRIPTION OF THE PREFERRED EMBODIMENT

Figure 1:
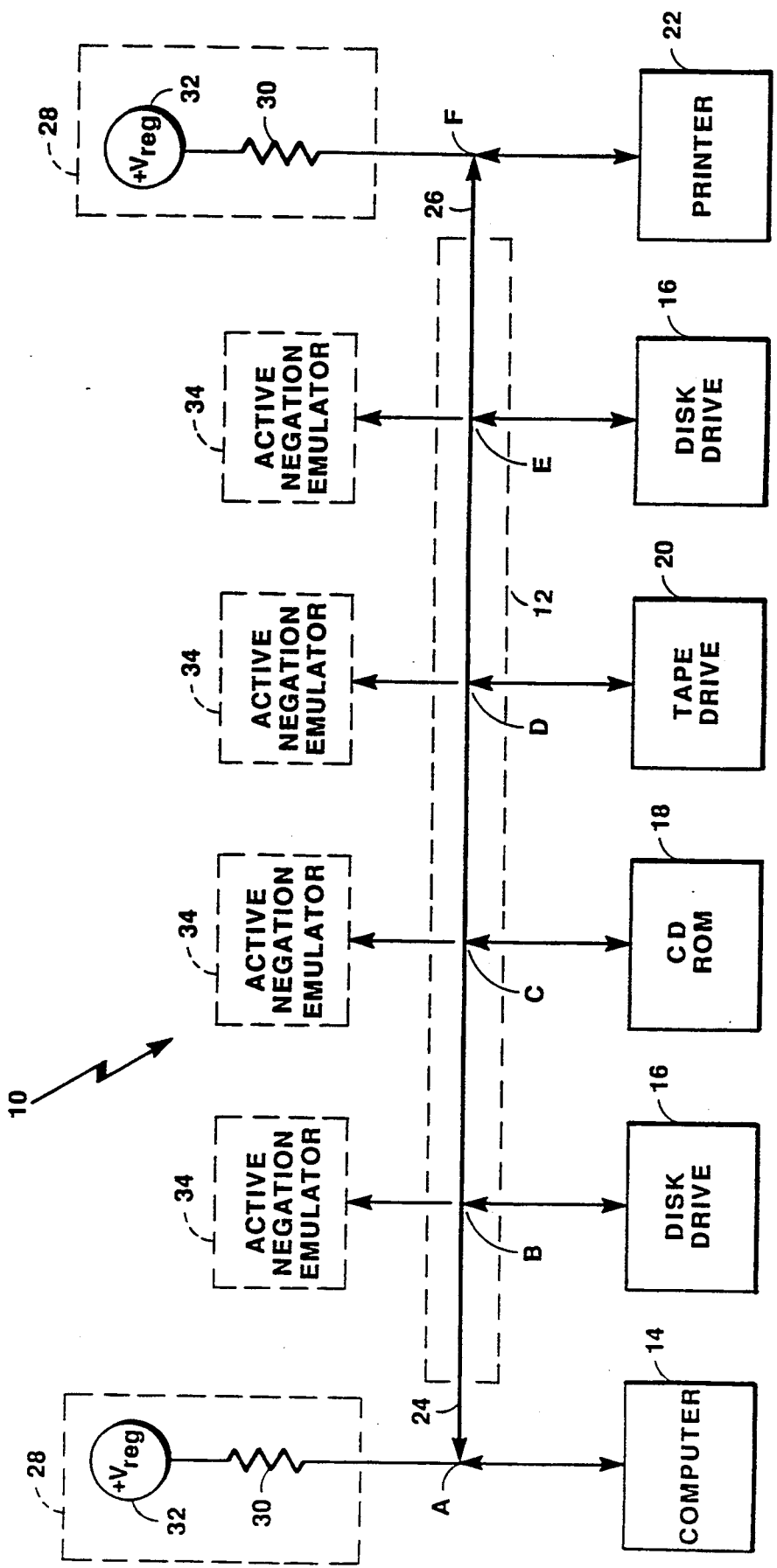
FIG. 1 is a block diagram of a computer system interface arrangement.

Referring now to FIG. 1, a computer interface arrangement 10 is shown to include a signal interface bus 12 of any conventional type, such as a SCSI bus. Signal interface bus 12 couples signals between a computer 14 and various associated devices such as disk drives 16, a CD ROM 18, a tape drive 20, and a printer 22. More particularly, the devices are daisy-chain coupled along the interface bus 12, as is conventional. Ends 24, 26 (i.e., locations labelled A, F) of signal interface bus 12 are terminated with termination networks 28, as shown. Termination networks 28 will be described in greater detail below in conjunction with FIG. 3. Suffice it here to say however that terminators 28 are resistive-type terminators comprising a resistor 30 and a regulated voltage source 32. Also shown in FIG. 1, are a plurality of active negation emulator circuits 34, alternatively referred to hereinafter as responsive drivers 34. Circuits 34 will be described in greater detail below in conjunction with FIGS. 3 and 4.

Active negation emulators 34 are coupled to signal interface bus 12 at a plurality of locations (i.e., locations labelled B-E) between the ends 24, 26 thereof. More particularly, circuits 34 are preferably coupled to signal interface bus 12 at intermediate locations B-E corresponding to the locations at which associated computer devices, such as disk drives 16, CD ROM 18, and tape drive 20, are coupled to the bus 12.

Active negation emulators 34 improve the integrity of logic signals carried by interface bus 12 by improving the noise margin thereof. More specifically, such circuits 34 improve the signal voltage level by boosting or raising such level to the desired logic high voltage level when the bus voltage exceeds a first predetermined value indicative of a logic high state. For example, consider the case where a logic high state corresponds to a signal voltage level of greater than approximately 2.0 volts and ideally, under steady state conditions, 2.8 volts (i.e., typically the initial logic high voltage level is between approximately 2.0 and 2.5 volts due to the impedance mismatch between the bus cable and the terminator) and a logic low state corresponds to a signal voltage level of less than approximately 0.5 volts and ideally, under steady state conditions, zero volts (i.e., typically the initial logic low voltage level is between approximately 0.2 and 0.4 volts). The first predetermined value indicative of a logic high state (i.e., that voltage level distinguishing a logic low signal from a logic high signal) is between the logic low threshold voltage of 0.5 volts and the logic high threshold voltage of 2.0 volts; for example, such first predetermined value may be approximately 1.2 volts. Active negation emulators 34 include sensors for sensing the level of the voltage on the interface bus 12. In response to such voltage level exceeding the first predetermined value, such as 1.2 volts, emulators 34 source a current to the interface bus 12 to ensure that the signal voltage level corresponds to at least the logic high threshold voltage of 2.0 volts, and preferably a desired logic high level of 2.8 volts. More particularly, the desired logic high voltage level here corresponds to the steady state logic high bus voltage, here determined by the regulated voltage source 32 of 2.8 volts. That is, it is desirable that current be sourced to the bus 12 to raise the voltage level of a logic high signal to 2.8 volts in order to improve noise margin. However, it is further desirable to stop the follow of current from emulator 34 once the logic signal reaches 2.8 volts in order to avoid sourcing current into the terminators 28, and the undesirable power dissipation associated therewith.

Thus, emulators 34 further include means for stopping the flow of current to the interface bus 12 when the voltage level thereon exceeds a second predetermined value. More particularly, once the signal carried by bus 12 reaches a voltage level corresponding to the desired logic high voltage level (i.e., 2.8 volts), emulator 34 ceases the flow of current to the signal bus 12, thereby ensuring that current is not sourced into terminators 28 and also that the logic signal does not overshoot or exceed the desired logic high voltage level.

Figure 2:
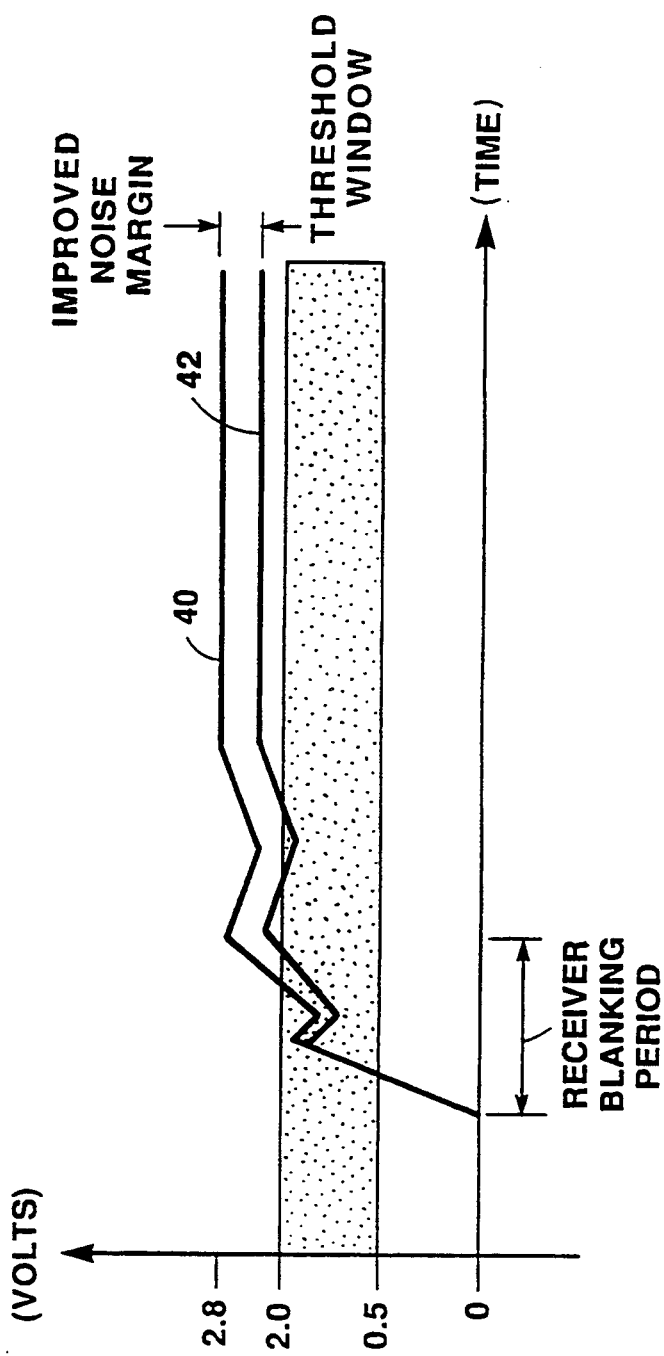
FIG. 2 shows a comparison of an exemplary signal carried by the signal interface bus of FIG. 1 and a like signal carried by a conventional interface bus not having an active negation emulator coupled thereto.

The above described operation of emulator 34 will become more apparent by referring now to FIG. 2 which shows a comparison between an exemplary logic signal 40 carried by the signal bus 12 of FIG. 1 (i.e., with an emulator 34 coupled thereto) as well as a like logic signal 42 carried by a conventional signal bus 12 (i.e., not having an emulator 34 coupled thereto). A threshold window is shown between 0.5 volts and 2.0 volts and corresponds the voltages between which a SCSI receiver does not distinguish between a logic high and a logic low state. Also shown is a "receiver blanking period", a duration typically on the order of ten nanoseconds. In accordance with the SCSI interface standard, SCSI device receivers essentially ignore the bus 12 for this blanking period after receiving a valid logic high signal in order to avoid erroneous communication between devices. More particularly, such erroneous communication may result from ringing on the signal during transitions.

Referring first to logic signal 42, such signal is here shown transitioning from a low logic state to a high logic state. However, as can be seen, logic signal 42 does not clearly reach the desired logic high voltage level. Referring now to logic signal 40, once such signal exceeds the first predetermined value, here 1.2 volts, the signal is assisted in transitioning to the logic high state by emulator 34. More specifically, and as will be described in greater detail below, a current is provided to the signal bus 12 to raise the voltage level of the logic signal 40 above the 2.0 volt logic high threshold and to the desired logic high voltage level of 2.8 volts. In this way, the noise margin of logic signal 40 is improved over that of logic signal 42. In fact, active negation emulator 34 has been found to improve noise margins by between approximately 100 and 200 millivolts. Additionally, once signal 40 exceeds the second predetermined value, here 2.8 volts, the supply of current stops, thereby preventing signal 40 from sourcing DC current to the terminator 28.

Figure 3:
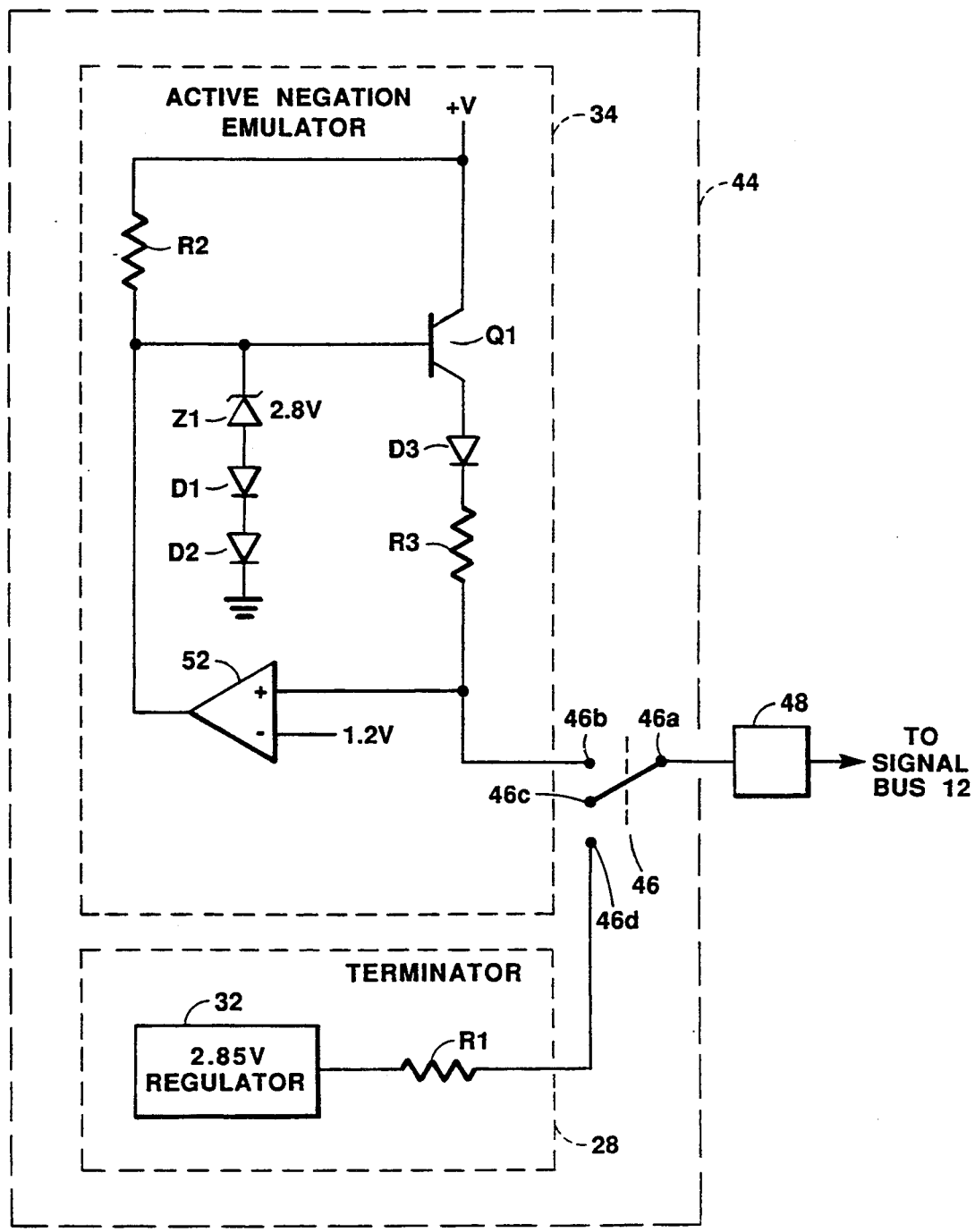
FIG. 3 is a simplified schematic of a combination circuit comprising the active negation emulator and the resistive terminator of FIG. 1.

Referring now to FIG. 3, a further aspect of the invention, referred to hereinafter as a combination circuit 44, is shown to include active negation emulator 34 and terminator 28 (FIG. 1). Combination circuit 44 further includes a switch 46 for selectively coupling the terminator 28 to the signal interface bus 12, coupling the emulator 34 to signal interface bus 12, or decoupling both the emulator 34 and the terminator 28 from the bus 12. The switch 46 has a first terminal 46a coupled to a circuit port 48, a second terminal 46b coupled to the emulator 34, a third terminal 46c with no 22 connection, and a fourth terminal 46d coupled to the terminator 28. Circuit port 48 here represents any conventional connector device adapted for coupling to the peripheral device. Switch 46 is adapted to be in a first position in which terminals 46a and 46b are interconnected, thereby coupling emulator 34 to the bus 12, a second position in which terminals 46a and 46c are interconnected, thereby decoupling both emulator 34 and terminator 28 from the bus 12, and a third position in which terminals 46a and 46d are interconnected, thereby coupling the terminator 28 to signal bus 12.

Referring now more specifically to switch 46, such selective coupling means couples the emulator 34 to bus 12 when the combination circuit 44 is coupled to an intermediate position or location along the bus 12 (i.e., locations B-E between ends 24, 26) at which a device such as a disk drive 16 for example (FIG. 1) is also coupled. On the other hand, when combination circuit 44 is coupled to one of the ends 24, 26 (i.e., locations A, F) of bus 12, switch 46 is positioned to couple terminator 28 to such bus 12. Moreover, when combination circuit 44 is coupled to the bus 12 at an intermediate position along bus 12, at which there is no device coupled, switch 46 decouples both emulator 34 and terminator 28 from the bus 12. In this way, the switch 46 is controlled as a function of the position or location of combination circuit 44 along the bus 12 and the combination circuit is operable in a first bus termination mode and a second responsive driver mode. That is, in the responsive driving mode, active negation emulator 34 is coupled to the bus and supplies a current to the bus in response to the bus voltage exceeding a first predetermined value, as described above.

Referring briefly back to FIG. 1, it is noted that emulators 34 and terminators 28 preferably comprise combination circuits 44. That is, a plurality of combination circuits 44 are coupled to interface bus 12 at locations A-F and the switch 46 (FIG. 3) of each such circuit 44 is positioned to couple either the terminator 28 thereof to the bus 12 (for those circuits 44 coupled to end positions A, F of bus 12) or to couple the emulator 34 thereof to the bus 12 (for those circuits coupled to intermediate positions B-E of bus 12). Note also that it may be desirable to couple combination circuits 44 to positions along bus 12 at which no device is coupled (not shown). In this way, flexibility for future expansion or modification of the interface arrangement 10 is provided. Consider for example the case where a plurality of combination circuits 44 are coupled the bus 12 at locations A-F thereof. When the bus 12 is to be expanded by the addition of new devices, the switch 46 of the combination circuit coupled to the "new" end thereof (not shown, such position being that at which a new device is coupled) is positioned to couple the terminator 28 thereof to the bus 12; whereas, the switch 46 of the combination circuit 44 coupled to the "old" end (for example location F) is positioned to couple the emulator 34 thereof to the bus 12.

It may be desirable to provide a switch 46 adapted for manual, operator actuable control, such as a dip switch that is set to the proper position upon installation of devices and is easily accessible for modification as necessary in accordance with changes to the computer interface arrangement 10. Alternatively however, it may be desirable to provide a solid state switch 46, such as a transistor, such switch 46 being adapted for control by remote means, such as through software, so that physical access to the switch 46 is not required to change the position thereof.

Referring first to terminator 28, such terminator is shown to include a resistor R1 and a voltage source, and here a voltage regulator 32. With this arrangement, voltage regulator 32, in combination with resistor R1, provides a constant impedance to the interface bus 12. However, it should be appreciated that any suitable bus termination network may be substituted for resistive terminator 28. Here, resistor R1 has a value of approximately 110 ohms. As described in conjunction with FIG. 1 above, such a terminator 28 is located at both ends 24, 26 of interface bus 12.

Turning now to the active negation emulator 34, such emulator 34 is adapted for coupling to interface bus 12 when switch 46 is positioned to connect terminals 46a and 46b thereof. With this arrangement, and as mentioned above, emulator 34 senses the voltage on signal bus 12 and supplies a current to signal bus 12 in response thereto. Thus, emulator 34 may be referred to as a responsive driver. More particularly, emulator 34 sources a current to signal bus 12 if the voltage level thereon exceeds the first predetermined value (i.e., 1.2 volts) indicative of a logic high signal. With regard to the selection of the first predetermined value indicative of a logic high signal, it is noted that while such value is generally between the logic high and the logic low threshold voltage levels, certain considerations should be kept in mind. Namely, if the first predetermined value is too high, logic signals transitioning from a low to a high state which do not reach such level will be unassisted by emulator 34. Moreover, if the first predetermined value is too low, noise may cause emulator 34 to source a current even when the logic signal on bus 12 is not in a high state. Here, 1.2 volts has been selected as the first predetermined value since it is approximately midway between the logic high and logic low threshold voltages of 0.5 and 2.0 volts, respectively.

Emulator 34 includes a comparator 52, having an input (i.e., here positive) coupled to circuit port 48 and thus also to signal bus 12 when switch 46 is positioned to couple terminals 46a, 46b thereof. A second input (i.e., here negative) of comparator 52 is coupled to a reference voltage, here of 1.2 volts. The output of comparator 52 is coupled to a first terminal of a resistor R2, to the base electrode of an npn transistor Q1, and to the cathode of a Zener Diode Z1, the anode of which is coupled to series diodes D1 and D2, as shown. A second terminal of resistor R2 is coupled to the collector electrode of transistor Q1 and a supply voltage +V, here of 5.0 volts. The emitter electrode of transistor Q1 is coupled to the anode of diode D3, the cathode of which is coupled to a first terminal of a resistor R3. The second terminal of resistor R3 is coupled to the positive input of comparator 52, as shown. Here resistor R2 has a value of 20K ohms and resistor R3 has a value of 200 ohms.

In operation, comparator 52 senses the bus voltage by comparing the voltage thereon with the first predetermined value and here, the 1.2 volt reference voltage. When the signal bus voltage is less than 1.2 volts, the output of open collector comparator 52 is low, thereby pulling the base electrode of transistor Q1 low. Thus, transistor Q1 is biased to a non-conducting state and the voltage on signal bus 12 is unaffected by emulator 34. Once the voltage level on signal bus 12 exceeds the first predetermined value, here 1.2 volts, the output of open collector comparator 52 goes high and the base electrode of transistor Q1 is driven by the supply voltage +V through resistor R2. While the scheme for driving transistor Q1 within its active region will be described in greater detail below in conjunction with FIG. 4, suffice it here to say that the base of transistor Q1 will be driven only to a voltage of 2.8 volts (i.e., the voltage across zener diode clamp Z1) plus the voltage drop across diodes D1 and D2. With this arrangement, transistor Q1 conducts (i.e., or switch Q1 "closes") providing a voltage of 2.8 V+V$_{be}$ at the emitter of transistor Q1 and a voltage of 2.8 V at the cathode of diode D3. Due to the voltage drop across resistor R3 (i.e., equal to 2.8 V minus the bus voltage), a current is provided to circuit port 48 and thus, also to signal bus 12. That is, a current is sourced from the supply voltage+V, through transistor Q1, diode D3, resistor R3, and switch 46 to signal bus 12.

Once the voltage on signal bus 12 reaches the second predetermined value, the supply of current to the bus 12 stops. Here, such second predetermined value corresponds to the desired logic high voltage level of 2.8 volts. Thus, once the voltage on signal bus 12 reaches a level of approximately 2.8 volts, there is zero voltage drop across resistor R3 and transistor Q1 becomes reverse biased, thereby ceasing conduction (i.e., or switch Q1 "opens"). Thus, the current is no longer sourced to signal bus 12. In this way, undesirable power dissipation caused by supplying current to terminator 28, as well as overshoot of the bus signal, is prevented.

Figure 4:
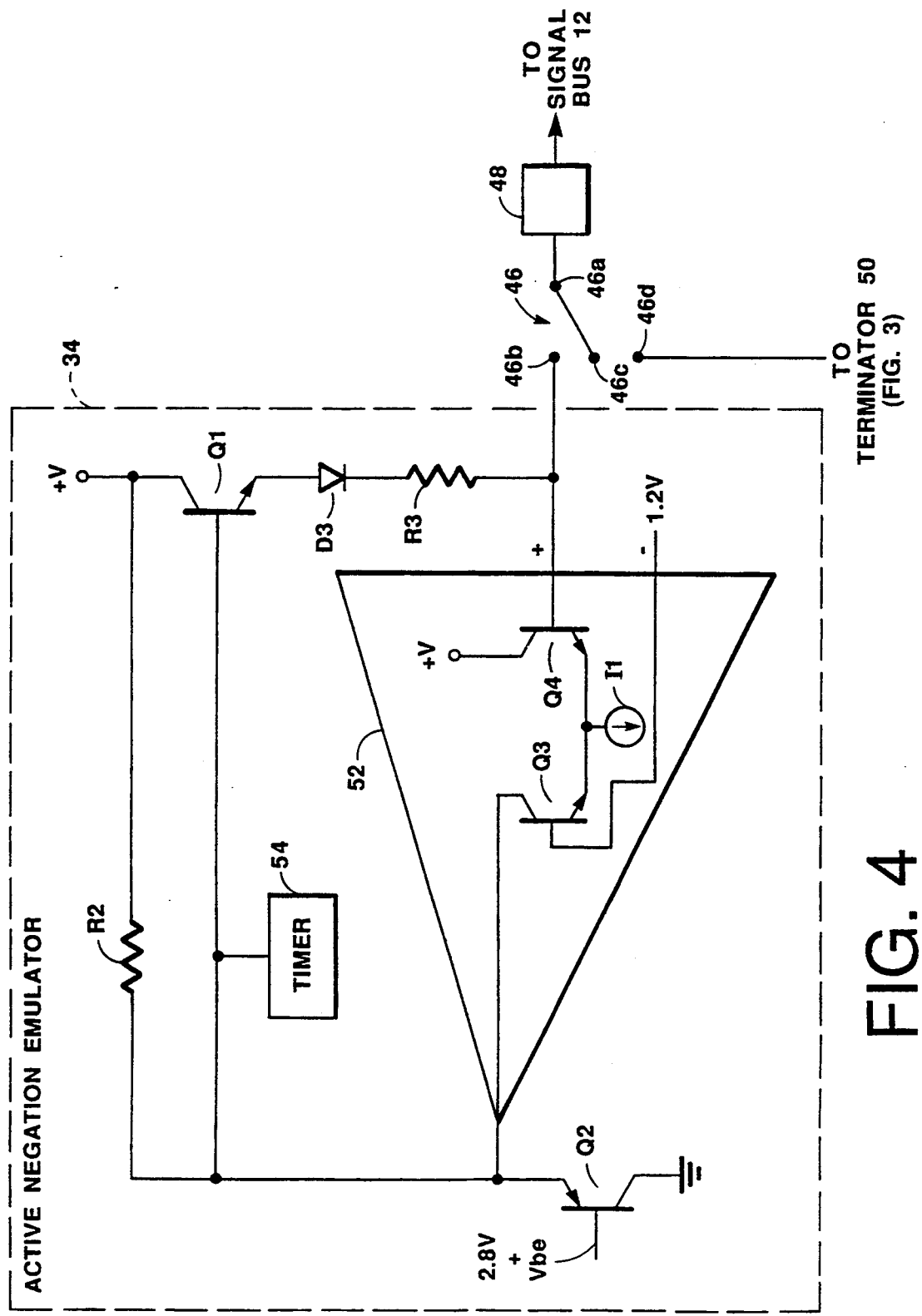
FIG. 4 is a detailed schematic of the active negation emulator circuit of FIG. 3.

Turning now to FIG. 4, implementation details and additional features of the active negation emulator 34 are shown. Comparator 52 is here comprised of npn transistors Q3, Q4 and a constant current source I1. Transistors Q3 and Q4 have a common emitter electrode connection, with such emitter electrodes being further coupled to constant current source I1. Here, current source I1 is a 1.5 milliamp ampere source. The base electrode of transistor Q3 provides the negative input of comparator 52 and is coupled to the 1.2 volt reference voltage. The base electrode of transistor Q4 provides the positive input of comparator 52 and is coupled to signal bus 12 via port 48, as shown. The output of comparator 52 is provided at the collector electrode of transistor Q3 and the collector electrode of transistor Q4 is coupled to the supply voltage+V. A high level voltage clamp is provided by a transistor Q2, the emitter electrode of which is coupled to the output of comparator 52 and the base electrode of transistor Q1, as will be described. The base electrode of transistor Q2 is coupled to a voltage source here having a level of 2.8 volts plus a transistor base to emitter voltage drop. A diode D3 is coupled between the emitter electrode of Q1 and the first terminal of resistor R3, the second terminal of which is coupled to the positive input of comparator 52.

In operation, considering again the case where the signal bus voltage level is initially less than 1.2 volts, transistor Q3 conducts the current I1 and transistor Q4 is off. With this arrangement, the base of transistor Q1 is pulled low through conducting transistor Q3 and current source I1. As noted above, this arrangement ensures that transistor Q1 is not conducting, thereby preventing a current from flowing through transistor R3 to signal bus 12. In this way, bus 12 is unaffected by or isolated from emulator 34 when the voltage level thereon is less than 1.2 volts. Once the signal bus voltage exceeds the first predetermined value of 1.2 volts, transistor Q3 is turned off and transistor Q4 conducts the current I1. With this arrangement, the output of comparator 52 represents a high impedance and the base electrode of the transistor Q1 is driven by the supply voltage+V through resistor R2. Transistor Q1 thus conducts, thereby sourcing a current from the supply voltage+V through transistor Q1, diode D3, and resistor R3 to the signal bus 12. Once the signal bus voltage has reached the proper logic high voltage amplitude (i.e., the second predetermined value), here of approximately 2.8 volts, diode D3 and transistor Q1 become reverse biased. In this way, transistor Q1 is turned off to stop the flow of current to the signal bus 12, thereby preventing current from being supplied to terminator 28.

It is noted that the range of the active region of transistor Q1 is controlled by the high level voltage clamp transistor Q2 and low level voltage clamping is provided by the selection of the values of resistor R2 and current source I1. More particularly, when the bus voltage exceeds 1.2 volts and transistor Q1 conducts as described above, the voltage on the base electrode of transistor Q1 is controlled by the supply voltage+V, the value of resistor R2, and the current source I1. Specifically, the voltage at the base of transistor Q1 is clamped low by the supply voltage+V minus the transistor base to emitter voltage drop and further, minus the voltage drop across resistor R2 (i.e., such voltage drop being the current I1 multiplied by resistance R2). The current source I1 is selected in order to ensure that in this condition, transistor Q2 is off and transistor Q1 does not saturate. The active region of transistor Q1 is limited on the high end by transistor Q2 which clamps the voltage at the base of transistor Q1 at 2.8 volts plus 2 V$_{be}$.

An optional timer circuit 54 is shown in FIG. 4 coupled to the base electrode of transistor Q1. Timer 54 serves to ensure that when a logic signal transitions from a logic high state to a logic low state, current will not be supplied by emulator 34 to the bus 12 to boost the voltage level of such signal. That is, timer 54 ensures that a logic signal transitioning from a high to a low state will be unaffected by emulator 34. It is noted that typical transitions from a logic high to a logic low state occur within a duration of approximately five nanoseconds. Thus, it is felt that such a fast transition will not be sensed by comparator 52 before the signal has fallen to below 1.2 volts. Nevertheless, timer 54 may be provided to essentially disable the current source 34 after a predetermined duration. That is, once the bus voltage is sensed to be above 1.2 volts and the base of transistor Q1 therefore driven to conduction, timer 54 indicates a predetermined duration, after which timer circuit 54 pulls the base of transistor Q1 low for a duration during which the logic signal transitions to a low state.

Having described the preferred embodiments of the invention, it will now become apparent to one of skill in the art that other embodiments incorporating their concepts may be used. It is felt therefore that these embodiments should not be limited to disclosed embodiments but rather should be limited only by the spirit and scope of the appended claims.

I claim:

1. A circuit for improving the noise margin of logic signals carried by a signal interface bus by raising the voltage level thereof when such signals transition from a logic low state to a logic high state, said circuit comprising:
- a sensor for sensing the voltage on said bus;
- a variable current source, coupled to said sensor, for supplying a current to said bus when said bus voltage exceeds a first predetermined value; and
- a first switch for selectively coupling said variable current source to bus.

2. The circuit recited in claim 1 wherein said sensor comprises a comparator having a first input coupled to said bus, a second input coupled to a reference voltage, and an output and wherein said variable current source comprises a second switch having a first terminal coupled to said bus through said first switch, a second terminal, and a control terminal coupled to the output of said comparator, said second switch selectively opening and closing in response to said output of said comparator.

3. The circuit recited in claim 2 wherein said second switch comprises a solid state switching device.

4. The circuit recited in claim 2 wherein said second terminal of said second switch is coupled to a supply voltage and wherein said current is supplied to said bus when said second switch is closed.

5. The circuit recited in claim 2 further comprising a timer coupled to said control terminal of said second switch to permit said current to be supplied for a predetermined duration.

6. The circuit recited in claim 1 wherein said first predetermined value is between a logic high threshold voltage and a logic low threshold voltage.

7. The circuit recited in claim 2 further comprising means for opening said second switch to stop the supply of current to said bus when said bus voltage exceeds a second predetermined value.

8. The circuit recited in claim 7 wherein said second predetermined value corresponds to a steady state logic high bus voltage.

9. A method for improving the noise margin of logic signals carried by a signal interface bus by raising the voltage level thereof when such signals transition from a logic low state to a logic high state, said method comprising the steps of:
- selectively coupling a variable current source to said bus;
- sensing the voltage on said bus; and
- supplying a current to said bus with said variable current source when said sensed voltage exceeds a first predetermined value.

10. The method recited in claim 9 further comprising the step of stopping the supply of current to said bus when said sensed voltage exceeds a second predetermined value.

11. The method recited in claim 9 wherein said step of supplying said current to said bus further comprises the step of supplying said current for a predetermined duration.

12. The method recited in claim 9 wherein said first predetermined value is between a logic high threshold voltage and a logic low threshold voltage.

13. The method recited in claim 10 wherein said second predetermined value corresponds to a steady state logic high bus voltage.

14. A circuit adapted for coupling to a signal interface bus, said circuit comprising:
- a resistive terminator;
- a responsive driver for supplying a current to said bus in response to the voltage on said bus exceeding a first predetermined value; and
- switch means for selectively coupling said resistive terminator to said bus, coupling said responsive driver to said bus, or decoupling said resistive terminator and said responsive driver from said bus, wherein said resistive terminator is coupled to said bus when the circuit is coupled to one of a pair of ends of said bus and wherein said responsive driver is coupled to said bus when the circuit is coupled to said bus at a location disposed between said pair of ends of said bus.

15. The circuit recited in claim 14 wherein said responsive driver comprises means for providing said current for a predetermined duration.

16. The circuit recited in claim 15 wherein said means for providing said current for a predetermined duration comprises a timer.

17. The circuit recited in claim 14 wherein said current sourcing circuitry comprises means for stopping the supply of said current to said bus in response to the voltage on said bus exceeding a second predetermined value.

18. The circuit recited in claim 17 wherein said first predetermined value is between a logic high threshold voltage and a logic low threshold voltage and wherein said second predetermined value corresponds to a steady state logic high bus voltage.

19. The circuit recited in claim 14 wherein said switch comprises a solid state switching device.

20. The circuit recited in claim 14 wherein said responsive driver comprises:
- a sensor for sensing the voltage on said bus; and
- a variable current source, coupled to said sensor, for supplying a current to said bus when said voltage exceeds said first predetermined value.

21. The circuit recited in claim 20 wherein said sensor comprises a comparator having a first input coupled to said bus, a second input coupled to a reference voltage, and an output and wherein said variable current source comprises a switch having a first terminal coupled to said bus, a second terminal, and a control terminal coupled to the output of said comparator, said switch selectively opening and closing in response to the output of said comparator.

22. A method for selectively coupling either a resistive terminator or a variable current source to a signal interface bus, said method comprising the steps of:
- providing a resistive terminator;
- supplying a current from a variable current source in response to the voltage on said bus being greater than a predetermined value; and
- selectively coupling said resistive terminator to said bus, coupling said variable current source to said bus, or decoupling said resistive terminator and said variable current source from said bus.

23. The method recited in claim 22 wherein said step of selectively coupling further comprises the steps of coupling said resistive terminator to said bus at one of a pair of ends of said bus; and
- coupling said current source to said bus at a location disposed between said pair of ends of said bus.

24. The method recited in claim 23 wherein said current source providing step further comprises the step of providing said current for a predetermined duration.

25. The circuit recited in claim 1 further comprising a resistive terminator coupled to said first switch, wherein said first switch selectively couples said variable current source to said bus, couples said resistive terminator to said bus, or decouples said resistive terminator and said variable current source from said bus.

26. The method recited in claim 9 further comprising the step of selectively coupling a resistive terminator to said bus.

27. A circuit for improving the noise margin of logic signals carried by a signal interface bus by raising the voltage level thereof when such signals transition from a logic low state to a logic high state, said circuit comprising:

a sensor for sensing the voltage on said bus and providing an output signal indicative of whether said bus voltage exceeds a first predetermined value; and a variable current source, coupled to said sensor, for supplying a current to said bus when said voltage exceeds said first predetermined value, said variable current source comprising a switch having a first, control terminal coupled to a voltage source through a resistor and to the output of said voltage sensor, a second terminal coupled to said voltage source, and a third terminal coupled to said bus, wherein said switch is activated by said voltage source through said resistor when said sensor output signal indicates that said bus voltage is greater than said first predetermined value.

28. The circuit recited in claim 27 wherein said sensor comprises a comparator having a first input coupled to said bus, a second input coupled to a reference voltage, and an output coupled to the first, control terminal of said switch.

29. The circuit recited in claim 27 further comprising means for deactivating said switch to stop the supply of current to said bus when said bus voltage exceeds a second predetermined value.

30. The circuit recited in claim 29 wherein said switch is a transistor and is deactivated by said bus voltage reverse biasing said transistor when said bus voltage rises to said second predetermined value.

31. The circuit recited in claim 27 further comprising a diode and a resistor coupled in series between said third terminal of said switch and said bus.

32. The circuit recited in claim 27 further comprising a voltage clamp coupled to said control terminal of said switch.

33. A method for improving the noise margin of logic signals carried by a signal interface bus by raising the voltage level thereof when such signals transition from a logic low state to a logic high state, said method comprising the steps of:

sensing the voltage on said bus with a voltage sensor;

providing an output signal indicative of whether said sensed bus voltage exceeds a first predetermined value; and supplying a current to said bus when said sensed voltage exceeds said first predetermined value, said current being supplied through a switch having a first, control terminal coupled to a voltage source through a resistor and to the output of said voltage sensor, a second terminal coupled to said voltage source, and a third terminal coupled to said bus, wherein said switch is activated by said voltage source through said resistor when said output signal indicates that said bus voltage is greater than said first predetermined value.

34. The method recited in claim 33 further comprising the step of stopping the supply of current to said bus when said sensed voltage exceeds a second predetermined value.

35. The method recited in claim 34 further comprising the step of deactivating said current source by reverse biasing said switch when said bus voltage exceeds said second predetermined value.

36. The method recited in claim 33 further comprising the step of providing a diode and a resistor in series between said third terminal of said switch and said bus.

37. The method recited in claim 33 further comprising the step of providing a voltage clamp coupled to said control terminal of said switch.

* * * * *

UNITED STATES PATENT AND TRADEMARK OFFICE
CERTIFICATE OF CORRECTION

PATENT NO. : 5,336,948
DATED : August 9, 1994
INVENTOR(S) : Mark Jordan

It is certified that error appears in the above-indentified patent and that said Letters Patent is hereby corrected as shown below:

Column 5, line 3, "no 22 connection" should read --no connection--.

Signed and Sealed this

Twenty-eight Day of March, 1995

Attest:

BRUCE LEHMAN

*Attesting Officer*  *Commissioner of Patents and Trademarks*